US012675041B2

(12) United States Patent
Hamada et al.

(10) Patent No.: US 12,675,041 B2
(45) Date of Patent: Jul. 7, 2026

(54) AGGLUTINANT FOR PELLICLES, PELLICLE FRAME WITH AGGLUTINANT LAYER, PELLICLE, EXPOSURE ORIGINAL PLATE WITH PELLICLE, EXPOSURE METHOD, METHOD FOR PRODUCING SEMICONDUCTOR, AND METHOD FOR PRODUCING LIQUID CRYSTAL DISPLAY BOARD

(71) Applicant: Shin-Etsu Chemical Co., Ltd., Tokyo (JP)

(72) Inventors: Yuichi Hamada, Annaka (JP); Akinori Nishimura, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 480 days.

(21) Appl. No.: 17/498,892

(22) Filed: Oct. 12, 2021

(65) Prior Publication Data

US 2022/0113623 A1 Apr. 14, 2022

(30) Foreign Application Priority Data

Oct. 14, 2020 (JP) ................................. 2020-173103

(51) Int. Cl.
*G03F 1/64* (2012.01)
*C09J 133/08* (2006.01)
(Continued)

(52) U.S. Cl.
CPC .............. *G03F 1/64* (2013.01); *C09J 133/08* (2013.01); *C09J 133/14* (2013.01); *H10P 76/2042* (2026.01)

(58) Field of Classification Search
CPC ..................................... G03F 1/64; G03F 1/62
See application file for complete search history.

(56) References Cited

U.S. PATENT DOCUMENTS

2008/0311395 A1* 12/2008 Ukei ........................... C09J 7/22
428/354
2022/0214611 A1* 7/2022 Hamada .................... G03F 1/26
(Continued)

FOREIGN PATENT DOCUMENTS

CN 103715231 A * 4/2014 .......... H01L 27/3211
CN 107603533 A 1/2018
(Continued)

OTHER PUBLICATIONS

Office Action issued in corresponding Taiwanese Patent Application No. 110138089, dated Apr. 17, 2025.
(Continued)

*Primary Examiner* — Martin J Angebranndt
(74) *Attorney, Agent, or Firm* — Morgan, Lewis & Bockius LLP

(57) ABSTRACT

Provided is an agglutinant for pellicles that can reduce residues stuck onto an exposure original plate when a pellicle is peeled from the exposure original plate after exposure, in particular exposure using ArF as an exposure light source, and also provided are a pellicle, an exposure original plate with a pellicle, a method for regenerating an exposure original plate, and a peeling residue reduction method.
An agglutinant for pellicles for bonding a pellicle to an exposure original plate, the agglutinant comprising an acrylic polymer as a base material, the acrylic polymer comprising, as monomer components:
a (meth)acrylic acid alkyl ester having a $C_4$ or less alkyl group; and
a (meth)acrylic acid ester having an ether bond.

20 Claims, 1 Drawing Sheet

(51) Int. Cl.
  *C09J 133/14* (2006.01)
  *H10P 76/20* (2026.01)

(56) References Cited

U.S. PATENT DOCUMENTS

| | | | | | |
|---|---|---|---|---|---|
| 2022/0214612 A1 | * | 7/2022 | Hamada | ............. | H01L 21/0274 |
| 2022/0214613 A1 | * | 7/2022 | Hamada | .................. | G03F 1/26 |

FOREIGN PATENT DOCUMENTS

| | | | | |
|---|---|---|---|---|
| JP | 06027641 | A | * | 2/1994 |
| JP | H07102230 | A | * | 4/1995 |
| JP | 2001123136 | A | * | 5/2001 |
| JP | 2001200218 | A | * | 7/2001 |
| JP | 2003183599 | A | * | 7/2003 |
| JP | 2005200540 | A | * | 7/2005 |
| JP | 2006-146085 | A | | 6/2006 |
| JP | 5638693 | B2 | | 12/2014 |
| JP | 2016-018008 | A | | 2/2016 |
| JP | 2016173414 | A | * | 9/2016 |
| JP | 2018131493 | A | * | 8/2018 |
| KR | 20090116144 | A | * | 11/2009 |
| KR | 10184707 | B1 | * | 3/2013 |
| TW | 200846431 | A | | 12/2008 |
| TW | 201100513 | A | | 1/2011 |
| TW | 201712092 | A | | 4/2017 |
| TW | 201831626 | A | | 9/2018 |
| TW | 202024275 | A | * | 7/2020 |

OTHER PUBLICATIONS

Office Action issued in corresponding Taiwanese Patent Application No. 1101380898, dated Jul. 29, 2025.
Office Action issued in corresponding Korean Patent Application No. 10-2021-0136560, dated Mar. 23, 2026.

* cited by examiner

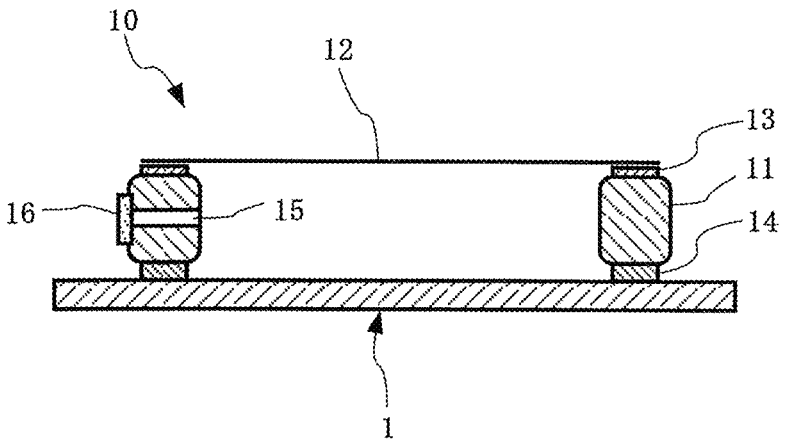

AGGLUTINANT FOR PELLICLES, PELLICLE FRAME WITH AGGLUTINANT LAYER, PELLICLE, EXPOSURE ORIGINAL PLATE WITH PELLICLE, EXPOSURE METHOD, METHOD FOR PRODUCING SEMICONDUCTOR, AND METHOD FOR PRODUCING LIQUID CRYSTAL DISPLAY BOARD

FIELD OF THE INVENTION

The present invention relates to an agglutinant for pellicles, a pellicle frame with an agglutinant layer, a pellicle, an exposure original plate with a pellicle, an exposure method, a method for producing a semiconductor, and a method for producing a liquid crystal display board.

TECHNICAL BACKGROUND OF THE INVENTION

In manufacturing semiconductor devices such as LSI and super-LSI or in manufacturing a liquid crystal display board or the like, a pattern is made by irradiating light to a semiconductor wafer or an original plate for liquid crystal, but if dust is attached to an exposure original plate used in this case, the dust absorbs the light or bends the light. As a result, the transferred pattern would be deformed, and the resulting pattern would have roughened edges or black stains on the base, which would lead to problems such as damaged dimensions, poor quality, and deformed external appearance. In the present invention, the "exposure original plate" is a generic name of lithography masks and reticles.

These works are usually performed in a cleanroom, but it is difficult to keep the exposure original plate clean all the time even in the cleanroom. Therefore, a pellicle that transmits light for exposure well is bonded to a surface of the exposure original plate as a dust-fender.

Under such circumstances, the dust does not directly adhere to the surface of the exposure original plate but adhere only to the pellicle film. Accordingly, when the focus is set on the pattern of the exposure original plate during lithography, the dust on the pellicle film becomes irrelevant to transfer.

The basic structure of the pellicle comprises a pellicle frame and a pellicle film stretched over the pellicle frame. The pellicle film is made of nitrocellulose, cellulose acetate, a fluorine-based polymer, or the like that well transmits light used for exposure (g-rays, i-rays, 248 nm, 193 nm, 157 nm, etc.). The pellicle frame is made of an aluminum alloy such as A7075, A6061, or A5052 treated with black alumite or the like, stainless steel, polyethylene, or the like. A good solvent of a pellicle film is applied to the upper part of the pellicle frame, and the pellicle film is bonded by air-drying or using an adhesive material such as an acrylic resin, an epoxy resin, or fluororesin. Further, since the lower part of the pellicle frame is mounted with an exposure original plate, an agglutinant layer obtained from a polybutene resin, a polyvinyl acetate resin, an acrylic resin, a silicone resin, or the like, and a protective liner for protecting the agglutinant layer are provided.

The pellicle is provided so as to surround a pattern region formed on the surface of the exposure original plate. Since the pellicle is provided to prevent the adhesion of dust to the exposure original plate, the pattern region and the outside of the pellicle are isolated from each other so that dust from the outside of the pellicle does not adhere to the pattern surface.

In recent years, miniaturization of LSI design rules to sub-quarter microns has progressed. Along with this, the wavelength of exposure light sources is becoming shorter. That is, the trend is moving from g-rays (436 nm) and i-rays (365 nm) produced by mercury lamps, which have been the mainstream until now, to KrF excimer laser (248 nm), ArF excimer laser (193 nm), $F_2$ laser (157 nm), and the like. As a result of progress in miniaturization, the allowable size of foreign substances and haze that may be generated on the pattern face of the mask substrate, which is an exposure original plate to which the pellicle is bonded, is becoming more and more strict.

PRIOR ART PUBLICATIONS

Publications

IP Publication 1: Japanese Patent No. 5638693
IP Publication 2: Japanese Patent Application Publication No. 2016-18008
IP Publication 3: Japanese Patent Application Publication No. 2006-146085
IP Publication 4: Japanese Patent Application Publication No. 2008-21182

SUMMARY OF THE INVENTION

Problems the Invention Seeks to Solve

In recent years, phase shift films have been commonly used as mask substrate films to meet the miniaturization of design rules. However, phase shift films are very delicate, and mask substrate cleaning under excessive conditions may cause damage, such as corrosion and scraping, to the phase shift films. For this reason, in recent years, there has been a tendency to reconsider chemicals used for mask substrate cleaning, and to weaken the cleaning conditions.

Furthermore, the mask pattern of advanced mask substrate products is shifting from positive type mask patterns, which have been the mainstream until now, to negative type mask patterns. As a result, there are many situations where no light-shading layer is provided in the portion to which the pellicle is bonded. If there is no light-shading layer, there is a possibility that the pellicle agglutinant is irradiated with an exposure light beam through the mask substrate. In that case, more residues of the agglutinant layer may remain on the mask substrate when the pellicle is peeled.

During use of a pellicle bonded to a mask substrate, if foreign substances and haze are generated, or if the pellicle film is damaged, it is necessary to peel the pellicle, subject the mask substrate to regeneration cleaning, and bond a new pellicle (which is hereinafter referred to as "repellicle"). It is the most important for repellicle that regeneration cleaning is performed so that the mask substrate is kept in a state of high cleanliness; however, in order to carry out regeneration cleaning of the mask substrate under recent weak cleaning conditions, it is important to reduce residues remaining on the mask substrate when the pellicle is peeled.

As regeneration cleaning, cleaning with chemicals such as sulfuric acid hydrogen peroxide or ammonia hydrogen peroxide, and physical cleaning by brushes, sponges, or the like are generally used. However, regeneration cleaning with functional water is being studied to prevent damage to mask substrates and sulfate ions from remaining on the mask substrates.

Functional water is generally defined by the Japanese Society for Functional Water as, among aqueous solutions that have been given reproducible and useful functions by artificial treatment, those for which the scientific basis for treatment and function has been clarified, and those for which such scientific basis is about to be clarified. Specific examples thereof include fine bubble water such as ozone water, hydrogen water, micro-bubble water, and nano-bubble water; electrolyzed water, supercritical water, sub-critical water, and the like. Ozone water and hydrogen water are often used to clean mask substrates. In addition, the cleaning power can be improved by adding a small amount of ammonia.

However, the present inventors found that since the cleaning power of functional water was weaker than that of chemicals such as sulfuric acid hydrogen peroxide, in the regeneration cleaning of the mask substrate after the removal of the pellicle, residues of the agglutinant layer that fixed the pellicle and the mask substrate were difficult to remove only by functional water cleaning. In particular, in phase shift photo masks, damage to phase shift films leads to changes in transmittance and phase difference, and it is thus difficult to add physical cleaning in addition to functional water cleaning.

Moreover, when lithography is performed using an exposure light beam such as ArF excimer laser (193 nm) on a lithography pellicle in which a pellicle film is stretched over the upper end face of a pellicle frame through a pellicle film bonding adhesive material layer, and in which an agglutinant layer is provided on the other end face, there is a problem that the agglutinant layer formed on the lower end face of the pellicle frame is altered by the exposure light beam, and many altered parts of the agglutinant layer remain on the exposure original plate as peeling residues when peeling from the exposure original plate.

Attempts have been made so far to reduce residues by adding surface modifiers or the like to agglutinants (IP Publications 1 and 2 described above). Further, as techniques of reducing residues, a large pellicle having an agglutinant layer with a cohesive fracture strength of 20 $g/mm^2$ or more (IP Publication 3 described above), and a pellicle comprising an agglutinant for pellicles and having a ratio of peeling strength and tensile strength of 0.10 or more and 0.33 or less are disclosed (IP Publication 4 described above).

The present invention was made in view of such circumstances, and an object of the present invention is to provide an agglutinant for pellicles that can reduce residues stuck onto an exposure original plate when a pellicle is peeled from the exposure original plate after exposure, in particular exposure using ArF as an exposure light source, and to also provide a pellicle frame with an agglutinant layer, a pellicle, an exposure original plate with a pellicle, and an exposure method. Another object of the present invention is to provide a method for producing a semiconductor device and a method for producing a liquid crystal display board that can thereby improve production efficiency.

Means to Solve the Problems

The above problems of the present invention have been solved by the following means.

[1] An agglutinant for pellicles comprising an acrylic polymer as a base material, the acrylic polymer comprising, as monomer components:
(A) a (meth)acrylic acid alkyl ester having a $C_4$ or less alkyl group; and
(B) a (meth)acrylic acid ester having an ether bond.

[2] An agglutinant for pellicles as claimed in [1] described above, further comprising (C) an unsaturated monomer having a carboxyl group or a hydroxyl group as a monomer component.
[3] An agglutinant for pellicles as claimed in [1] described above, wherein a ratio of the (A) component is 20 to 59 mass % in the whole monomer components.
[4] An agglutinant for pellicles as claimed in [1] described above, wherein a ratio of the (B) component is 40 to 79 mass % in the whole monomer components.
[5] An agglutinant for pellicles as claimed in [2] described above, wherein a ratio of the (C) component is 1 to 15 mass % in the whole monomer components.
[6] An agglutinant for pellicles as claimed in [1] described above, wherein the (A) (meth)acrylic acid alkyl ester having a $C_4$ or less alkyl group is a (meth)acrylic acid alkyl ester having a $C_4$ alkyl group.
[7] An agglutinant for pellicles as claimed in [1] described above, wherein the (B) (meth)acrylic acid ester having an ether bond is a (meth)acrylic acid ester having an ethylene oxide group.
[8] An agglutinant for pellicles comprising an acrylic polymer as a base material, the acrylic polymer comprising, as monomer components:
a (meth)acrylic acid alkyl ester having a $C_4$ alkyl group;
a (meth)acrylic acid ester having an ethylene oxide group; and
(C) an unsaturated monomer having a carboxyl group or a hydroxyl group.
[9] An agglutinant for pellicles as claimed in [1] described above, wherein the agglutinant is used to produce an ArF pellicle.
[10] A pellicle frame with an agglutinant layer, comprising:
a pellicle frame; and
an agglutinant layer provided on one end face of the pellicle frame and obtained from an agglutinant for pellicles as claimed in [1] described above.
[11] A pellicle comprising:
a pellicle film;
a pellicle frame provided with the pellicle film on one end face thereof; and
an agglutinant layer provided on the other end face of the pellicle frame and obtained from an agglutinant for pellicles as claimed [1] described above.
[12] An exposure original plate with a pellicle, comprising:
an exposure original plate; and
a pellicle as claimed in [11] described above mounted on the exposure original plate.
[13] An exposure method comprising performing exposure using an exposure original plate with a pellicle as claimed in [12] described above.
[14] An exposure method as claimed in [13] described above, wherein an exposure light source is ArF.
[15] A method for producing a semiconductor, comprising a step of performing exposure using an exposure original plate with a pellicle as claimed in [12] described above.
[16] A method for producing a semiconductor as claimed in [15] described above, wherein an exposure light source is ArF.
[17] A method for producing a liquid crystal display board, comprising a step of performing exposure using an exposure original plate with a pellicle as claimed in [12] described above.

[18] A method for producing a liquid crystal display board as claimed in [17] described above, wherein an exposure light source is ArF.

Effects of the Invention

The present invention can provide an agglutinant for pellicles that can reduce peeling residues of an agglutinant layer of a pellicle remaining on an exposure original plate when the pellicle is peeled from the exposure original plate after exposure, in particular exposure using ArF as an exposure light source, and can also provide a pellicle frame with an agglutinant layer, a pellicle, an exposure original plate with a pellicle, and an exposure method. According to the agglutinant for pellicles, pellicle frame with an agglutinant layer, pellicle, exposure original plate with a pellicle, and an exposure method of the present invention, even when an exposure light beam is applied through the exposure original plate, the pellicle can be peeled from the exposure original plate with few peeling residues of the agglutinant. As a result, the regeneration cleaning of the exposure original plate, from which the pellicle is removed, can proceed smoothly, and the cleaning conditions can be loosened; thus, there is an advantage in reducing damage to the exposure original plate surface during cleaning. In addition, production efficiency can be improved in the production of semiconductor devices and liquid crystal display boards.

In the pellicle of the present invention, it is assumed that since a specific acrylic polymer (also referred to as an acrylic resin) is used as the base material of the agglutinant, the intermolecular force inside the agglutinant is improved, appropriate adhesive strength can be maintained, and not only large residues but also particulate residues are reduced during peeling from the exposure original plate.

BRIEF DESCRIPTION OF DRAWINGS

FIG. 1 A conceptual diagram showing the basic structure of an exposure original plate with a pellicle in which the pellicle of the present invention is mounted on an exposure original plate.

EXAMPLES TO EMBODY THE INVENTION

First, the basic structure of the pellicle of the present invention will be described with reference to FIG. 1.

As shown in FIG. 1, the pellicle 10 of the present invention is such that a pellicle film 12 is stretched over the upper end face of a pellicle frame 11 through an adhesive material layer 13 for bonding the pellicle film. In this case, an agglutinant layer 14 for bonding the pellicle 10 to an exposure original plate (mask substrate or reticle) 1 is generally formed on the lower end face of the pellicle frame 11, and a protective liner (not shown) is peelably bonded to the lower end face of the agglutinant layer 14, if necessary. When such a protective liner is present, the pellicle 10 is mounted on the exposure original plate 1 after the protective liner is peeled. In addition, the pellicle frame 11 may be provided with an air pressure adjustment hole (vent) 15, and may be further provided with a dust removal filter 16 for the purpose of removing particles.

In this case, the size of these pellicle constituent members is equivalent to that of general pellicles, for example, pellicles for semiconductor lithography and pellicles for the lithography step in the production of large liquid crystal display boards. Moreover, the materials thereof can be known materials as described above.

The type of pellicle film 12 is not particularly limited. For example, amorphous fluoropolymers conventionally used for excimer laser are used. Examples of amorphous fluoropolymers include Cytop (trade name of AGC Inc.), Teflon (registered trademark) AF (trade name of DuPont), and the like. These polymers may be used after being dissolved in solvents, if necessary, during the production of pellicle films, and can be suitably dissolved, for example, in fluorine type solvents.

As for the base material of the pellicle frame 11, for example, conventionally used aluminum alloy materials, preferably JIS A7075, JIS A6061, and JIS A5052 materials, are used. There is no particular limitation as long as the strength as the pellicle frame is ensured. The pellicle frame surface is preferably roughened by sandblasting or chemical polishing, and a polymer coating may be provided after roughening. In the present invention, a conventionally known method can be employed as the method for roughening the frame surface. In a preferable method, the surface of an aluminum alloy material is subjected to blast treatment using stainless steel, carborundum, glass beads, or the like, and is further subjected to chemical polishing using NaOH or the like, thereby roughening the surface.

The present inventors conducted many discussions and experiments in order to solve the above problems of the present invention, particularly focused on the feature of the agglutinant forming the agglutinant layer, and comparatively analyzed the experimental results. As a result, the present inventors found that the following means was effective.

A first aspect of the agglutinant for pellicles of the present invention is to use, as a base material, an acrylic polymer comprising a (meth)acrylic acid ester having an ether bond as a monomer component. Because a (meth)acrylic acid ester having an ether bond is contained as a monomer component of an acrylic polymer, when the pellicle is peeled from the exposure original plate, peeling residues of the agglutinant layer remaining on the exposure original plate can be reduced. Due to the introduction of an ether bond into an acrylic polymer, it becomes easy to control the hydrophilicity of the acrylic polymer. In addition, due to the introduction of an ether bond into the side chain of an acrylic polymer, the ether bond is assumed to prevent light-deterioration of the main chain.

A second aspect of the agglutinant for pellicles of the present invention is to use, as a base material, an acrylic polymer comprising (A) a (meth)acrylic acid alkyl ester having a $C_4$ or less alkyl group and (B) a (meth)acrylic acid ester having an ether bond as monomer components. This makes it possible to maintain a good balance between the softness and resistance to tearing of the agglutinant. The present inventors consider that residues of the agglutinant are consequently less likely to remain on the exposure original plate when the pellicle is peeled from the exposure original plate, and that the effects of the present invention can be obtained.

In the present invention, the "agglutinant comprising an acrylic polymer as a base material" refers to an agglutinant containing an acrylic polymer itself or an agglutinant containing a reaction product of the acrylic polymer, a curing agent, and the like.

The present inventors found that in a pellicle provided with an agglutinant layer obtained from such an agglutinant, the agglutinant layer suppressed deterioration due to an exposure light beam, and that even if deterioration occurred, peeling residues were less likely to be generated during peeling from the mask substrate (exposure original plate).

In the present invention, the acrylic polymer is a polymer comprising (A) a (meth)acrylic acid alkyl ester having a $C_4$ or less alkyl group and (B) a (meth)acrylic acid ester having an ether bond as monomer components. Other monomer components copolymerizable with (meth)acrylic acid esters can be copolymerized, if necessary.

Examples of the (meth)acrylic acid alkyl ester having a $C_4$ or less alkyl group ((A) component) include propyl (meth) acrylates, such as methyl (meth)acrylate, ethyl (meth)acrylate, n-propyl (meth)acrylate, and isopropyl (meth)acrylate; butyl (meth)acrylates, such as n-butyl (meth)acrylate, sec-butyl (meth)acrylate, isobutyl (meth)acrylate, and tert-butyl (meth)acrylate; and the like. Among these, butyl (meth) acrylates having a $C_4$ alkyl group are preferable in terms of the balance between the softness and resistance to tearing of the agglutinant. These may be used singly or in combination of two or more.

Examples of the (meth)acrylic acid ester having an ether bond ((B) component) include (meth)acrylic acid esters having an alkylene oxide group, such as an ethylene oxide group, a propylene oxide group, or a butylene oxide group. Among these, (meth)acrylic acid esters having an ethylene oxide group (also referred to as ethylene oxide group-containing (meth)acrylates) are preferable. Examples thereof include methoxypolyethylene glycol (meth)acrylates, such as 2-methoxyethyl (meth)acrylate, 2-ethoxyethyl (meth)acrylate, 2-butoxyethyl (meth)acrylate, phenoxyethylene glycol (meth)acrylate, and methoxydiethylene glycol (meth)acrylate; ethoxypolyethylene glycol (meth)acrylates, such as ethoxydiethylene glycol (meth)acrylate; butoxypolyethylene glycol (meth)acrylates, such as butoxydiethylene glycol (meth)acrylate; phenoxypolyethylene glycol (meth)acrylates, such as phenoxydiethylene glycol (meth) acrylate; and the like. These may be used singly or in combination of two or more.

Examples of the unsaturated monomer having a carboxyl group or a hydroxyl group ((C) component) include α,β-unsaturated carboxylic acids, such as (meth)acrylic acid, maleic acid, crotonic acid, itaconic acid, and fumaric acid; hydroxyl group-containing (meth)acrylates, such as 2-hydroxyethyl (meth)acrylate, 2-hydroxypropyl (meth)acrylate, and 2-hydroxybutyl (meth)acrylate; and the like. These may be used singly or in combination of two or more.

Further, if necessary, the monomer components may include other monomers, such as (meth)acrylic acid alkyl esters having a $C_5$ or more alkyl group. Examples thereof include 2-ethylhexyl (meth)acrylate, n-octyl (meth)acrylate, and isooctyl (meth)acrylate, each of which has a $C_8$ alkyl group.

The ratio of the (A) component used in the acrylic polymer is preferably 20 to 59 mass %, and particularly preferably 30 to 50 mass %, in the whole monomer components. Because of the ratio of the (A) component within the above range, it becomes easy to control the balance between the softness and resistance to tearing of the agglutinant, and peeling residues.

The ratio of the (B) component used in the acrylic polymer is preferably 40 to 79 mass %, and more preferably 40 to 60 mass %, in the whole monomer components. Because of the ratio of the (B) component within the above range, it becomes easy to control adhesion and light resistance.

The ratio of the (C) component used in the acrylic polymer is preferably 1 to 15 mass %, and more preferably 5 to 15 mass % in the whole monomer components. Because of the ratio of the (C) component within the above range, it becomes easy to control peeling residues and the degree of crosslinking due to the reaction with a curing agent.

The acrylic polymer can be produced, for example, by selecting a known production method, such as solution polymerization, bulk polymerization, emulsion polymerization, or radical polymerization. Further, the obtained acrylic polymer may be any of a random copolymer, a block copolymer, a graft copolymer, and the like.

When the molecular weight of the acrylic polymer is within the range of 700,000 to 2.5 million as weight average molecular weight, the agglutinant layer has moderate cohesive force and adhesive strength, and the agglutinant causes less adhesive residues and has sufficient adhesive strength and load resistance, which is preferable.

The weight average molecular weight mentioned above is a value measured by gel permeation chromatography (GPC) analysis, and refers to a value in terms of standard polystyrene. The GPC analysis can be performed using tetrahydrofuran (THF) as an eluent.

In the present embodiment, a reaction product of the acrylic polymer and a curing agent is preferably contained as the agglutinant of the agglutinant layer; however, in terms of flexibility, an acrylic polymer that does not react with the curing agent may be contained.

Further, the agglutinant may contain a combination of two or more acrylic polymers. In that case, the monomer components of at least one acrylic polymer may include (A) a (meth)acrylic acid alkyl ester having a $C_4$ or less alkyl group and (B) a (meth)acrylic acid ester having an ether bond.

The curing agent is not particularly limited as long as it is a curing agent that is used as a general curing agent, and examples thereof include metal salts, metal alkoxides, aldehyde type compounds, non-amino resin type amino compounds, urea type compounds, isocyanate type compounds, polyfunctional epoxy compounds, metal chelate type compounds, melamine type compounds, aziridine type compounds, and the like. Among these, isocyanate type compounds and epoxy compounds are preferable, in terms of the reactivity with the carboxyl group or the hydroxyl group.

Examples of isocyanate type compounds include xylylene diisocyanate, hexamethylene diisocyanate, tolylene diisocyanate, and multimers, derivatives, and polymers thereof, and the like. These may be used singly or in combination of two or more.

Examples of epoxy compounds include compounds having two or more epoxy groups in the molecule, and specific examples thereof include ethylene glycol diglycidyl ether, polyethylene glycol diglycidyl ether, glycerin diglycidyl ether, glycerin triglycidyl ether, 1,6-hexanediol diglycidyl ether, trimethylolpropane triglycidyl ether, diglycidylaniline, diamine glycidylamine, N,N,N',N'-tetraglycidyl-m-xylylenediamine, 1,3-bis(N,N'-diamineglycidylaminomethyl), and the like. These may be used singly or in combination of two or more.

In addition, the agglutinant that forms the agglutinant layer of the pellicle may be mixed with other components, such as crosslinking agents, tackifiers, plasticizers, stabilizers, viscosity regulators, antistatic agents, lubricants, conductivity-imparting agents, flame retardancy-imparting agents, thermal conductivity-improving agents, heat resistance-improving agents, weather resistance-improving agents, thixotropy-imparting agents, antioxidants, antimicrobial agents, antifungal agents, and coloring agents, depending on the purpose within the range in which the effects of the present invention can be used.

As the means for forming the agglutinant layer 14, an uncured liquid or paste agglutinant is applied to the lower end face of the pellicle frame 11, followed by curing treatment, thereby forming an agglutinant layer. The agglutinant may be applied once, or may be repeatedly applied several times in order to obtain a predetermined thickness of the agglutinant layer. In this case, the agglutinant is preferably allowed to stand between each time of coating until the shape of the agglutinant after coating is stabilized. If it is difficult to apply an agglutinant due to its high viscosity, the agglutinant may be applied, if necessary, after dilution with an organic solvent, alcohol, water, or the like to reduce the viscosity of the agglutinant. The agglutinant can be applied, for example, by dipping, spraying, or brush coating, or by using a coating device with a dispenser or the like. Coating using a coating device with a dispenser is preferable, in terms of stability, workability, yield, and the like.

In the production of the pellicle 10, the coating and formation of the agglutinant layer 14 are generally performed first, followed by stretching of the pellicle film 12; however, the order may be reversed. For stretching the pellicle film 12, for example, an adhesive material is applied to the upper end face of the pellicle frame 11, and the pellicle frame 11 is then heated to cure the adhesive material. Finally, the upper end face of the pellicle frame 11, on which the adhesive material layer 13 for bonding a pellicle film is formed, is bonded to a pellicle film taken in an aluminum frame larger than the pellicle frame 11, and extra portions of the pellicle film protruding outside the pellicle frame 11 are removed, thereby completing the pellicle. If it is difficult to handle the pellicle film alone, a pellicle film supported by a frame such as silicon can be used. In that case, a pellicle can be easily produced, for example, by bonding the area of the frame and a pellicle frame.

Due to the use of the pellicle of the present invention with the configuration described above, the amount of agglutinant residues can be reduced when the pellicle is peeled from the exposure original plate after exposure. Therefore, the pellicle of the present invention is useful as a pellicle bonded to a phase shift photo mask having the delicate phase shift film mentioned above, or a face comprising silicon oxide, such as quartz, as a main component.

The pellicle of the present invention is also useful as a pellicle applied to exposure original plates whose agglutinant layer is irradiated with an exposure light beam during exposure, such as a negative type exposure original plate, an exposure original plate that has a non-shaded area or a semi-transparent shaded area in a portion thereof to which an agglutinant is bonded, and an exposure original plate that has a transparent area in a portion thereof to which an agglutinant is bonded. The agglutinant layer of the pellicle used in such an exposure original plate is exposed to an exposure light beam through the exposure original plate from the face of the exposure original plate opposite to the face provided with the pellicle.

The pellicle of the present invention may be used not only as a protective member for suppressing the adhesion of foreign substances to the exposure original plate in the exposure device, but also as a protective member for protecting the exposure original plate during storage or transportation of the exposure original plate. An exposure original plate with a pellicle can be produced by mounting the pellicle described above on an exposure original plate, such as a mask substrate.

The method for producing a semiconductor or a liquid crystal display board according to the present embodiment comprises a step of exposing a substrate (semiconductor wafer or liquid crystal original plate) using the exposure original plate with a pellicle described above. For example, in the lithography step, which is one of the steps for producing semiconductors or liquid crystal display boards, in order to form a photoresist pattern corresponding to an integrated circuit etc. on a substrate, the exposure original plate with a pellicle described above is set on a stepper to perform exposure. As a result, if foreign substances adhere to the pellicle in the lithography step, the foreign substances do not form images on the wafer coated with a photoresist; thus, the short circuit, disconnection, and the like of the integrated circuit etc. due to images of the foreign substances can be prevented. Therefore, the use of the exposure original plate with a pellicle can improve the yield in the lithography step.

In general, when a desired number of times of lithography steps are performed, when foreign substances and haze are generated, or when the pellicle film is damaged, the pellicle is peeled from the exposure original plate, and the exposure original plate is subjected to regeneration cleaning in some cases. Due to the use of the pellicle of the present invention, peeling residues during repellicle can be reduced even in the case of exposure original plates whose agglutinant layer is irradiated with an exposure light beam during exposure, such as an exposure original plate having a face comprising silicon oxide as a main component in which peeling residues of the agglutinant layer are likely to be generated, a negative type exposure original plate whose agglutinant layer is irradiated with an exposure light beam more than before, an exposure original plate that has a non-shaded area or a semi-transparent shaded area in a portion thereof to which an agglutinant is bonded, whose agglutinant layer is irradiated with an exposure light beam more than before, and an exposure original plate that has a transparent area in a portion thereof to which an agglutinant is bonded, whose agglutinant layer is irradiated with an exposure light beam more than before.

Moreover, since the use of the pellicle of the present invention can reduce peeling residues of the agglutinant layer, cleaning with functional water can be easily applied, and cleaning properties for delicate exposure original plates, such as phase shift photo masks, can be improved. In addition, the use of the pellicle of the present invention can contribute to the reduction of environmental burden caused by cleaning with functional water.

EXAMPLES

The present invention will be described in more detail below with reference to Examples. The "mask" in the Examples and Comparative Examples is described as an example of the "exposure original plate." Needless to say, it can also be applied to reticles.

Example 1

After a pellicle frame (external size: 149 mm×115 mm×3.5 mm, thickness: 2 mm, flatness of an end face coated with a mask bonding agglutinant: 15 um) made of an aluminum alloy was subjected to precision cleaning, an acrylic agglutinant manufactured by Soken Chemical Co., Ltd. (product name: SK-Dyne SN-25B, an agglutinant containing, as a base material, an acrylic polymer containing an ethylene oxide group-containing (meth)acrylate and butyl acrylate as monomer components, in which about 40 mass % of the monomer components was the ethylene oxide group-containing (meth)acrylate, and about 40 mass % of the monomer components was the butyl acrylate) was applied to the end face with a flatness of 15 um, and allowed to stand for 60 minutes at room temperature. Thereafter, a separator was placed on an aluminum plate with a flatness of 5 um, and the pellicle frame coated with the agglutinant was placed so that the agglutinant faced down. Thus, the agglutinant was brought into contact with the flat separator and flattened.

Next, the pellicle on the aluminum plate was placed in an oven at 60° C. for 60 minutes to cure the agglutinant.

After the pellicle frame together with the aluminum plate was taken out from the oven, the separator was peeled.

Thereafter, an adhesive material manufactured by AGC Inc. (product name: Cytop CTX-A) was applied to the end face opposite to the end face coated with the agglutinant. Then, the pellicle frame was heated at 130° C. to cure the adhesive material.

Finally, the adhesive material-coated end face of the pellicle frame was bonded to a pellicle film taken in an aluminum frame larger than the pellicle frame, and portions outside the pellicle frame were removed, thereby completing the pellicle.

Next, a 6025 mask substrate (6 inch) and the previously prepared pellicle were set in a bonding device, and pressurized at a bonding load of 50 N for a load time of 30 seconds to bond the pellicle to the mask substrate.

After the mask substrate to which the pellicle was bonded was left for 24 hours at room temperature, the back surface of the mask was irradiated with ultraviolet rays at 10 mJ/cm$^2$ using a 193-nm ultraviolet lamp so that the light beam was applied to the pellicle agglutinant.

After ultraviolet irradiation, the resultant was left for 1 hour at room temperature, and then the pellicle was slowly peeled upward from the mask substrate at a speed of 0.1 mm/sec.

When the mask substrate after peeling was visually observed, a pale opaque band, which was considered to be agglutinant solute residues, was slightly found in the contour portion to which the pellicle was bonded, and the surface of the mask substrate was obviously cleaner than the Comparative Examples, described later. The residues could be removed by dipping in a cleaning tank using functional water (hydrogen and ammonia were added to ultrapure water) in combination with ultrasonic waves (functional water overflowed) for 5 minutes.

Comparative Example 1

A pellicle was completed in the same manner using the same materials as in Example 1, except that the agglutinant used herein was an acrylic agglutinant manufactured by Soken Chemical Co., Ltd. (product name: SK-Dyne SK-1425S, an agglutinant containing, as a base material, an acrylic polymer containing butyl acrylate as a monomer component but not containing a (meth)acrylic acid ester having an ether bond as a monomer component). Further, the pellicle was bonded to and peeled from a mask substrate under the same conditions as in Example 1.

When the mask substrate after peeling was visually observed, pale agglutinant solute residues were found in the portion to which the pellicle was bonded. The peeling residues could not be completely removed by cleaning for 5 minutes twice using the same equipment as in Example 1. Accordingly, light rubbing using a foamed polyvinyl alcohol was necessary before cleaning.

Comparative Example 2

A pellicle was completed in the same manner using the same materials as in Example 1, except that the agglutinant used herein was an acrylic agglutinant manufactured by Soken Chemical Co., Ltd. (product name: SK-Dyne SK-1495S, an agglutinant containing, as base material, an acrylic polymer not containing a (meth)acrylic acid ester having an ether bond and butyl acrylate as monomer components). Further, the pellicle was bonded to and peeled from a mask substrate under the same conditions as in Example 1.

When the mask substrate after peeling was visually observed, pale agglutinant solute residues were found in the portion to which the pellicle was bonded. The peeling residues could not be removed only by ultrasonic cleaning with functional water, as in Comparative Example 1, but could be removed by the combined use of rubbing cleaning with a foamed polyvinyl alcohol before ultrasonic cleaning.

Synthesis Example 1

A 5-L flask equipped with a stirrer, a reflux condenser, a thermometer, and a gas inlet was charged with 350 g of butyl acrylate, 550 g of 2-methoxyethyl acrylate, 40 g of acrylic acid, 25 g of 2-hydroxyethyl acrylate, 1400 g of ethyl acetate, and 2 g of azobisisobutyronitrile as a polymerization initiator. Solution polymerization was carried out at 68° C. for 8 hours in a nitrogen gas stream. After the completion of the reaction, 830 g of ethyl acetate was added thereto, thereby obtaining a solution of an acrylic polymer with a solid content of 30%. A polyisocyanate solution was added to the obtained acrylic polymer solution, and the mixture was stirred and mixed to obtain an agglutinant.

Synthesis Example 2

A 5-L flask equipped with a stirrer, a reflux condenser, a thermometer, and a gas inlet was charged with 360 g of propyl acrylate, 500 g of 2-ethoxyethyl acrylate, 50 g of acrylic acid, 1300 g of ethyl acetate, and 2 g of azobisisobutyronitrile as a polymerization initiator. Solution polymerization was carried out at 68° C. for 8 hours in a nitrogen gas stream. After the completion of the reaction, 1130 g of ethyl acetate was added thereto, thereby obtaining a solution of an acrylic polymer with a solid content of 30%. A polyisocyanate solution was added to the obtained acrylic polymer solution, and the mixture was stirred and mixed to obtain an agglutinant.

Examples 2 and 3

Pellicles were produced in the same manner as in Example 1, except that the agglutinant used herein was each of the agglutinants obtained in Synthesis Examples 1 and 2, and a peeling test was performed in the same manner as in Example 1. As a result, the pellicles using any of the agglutinants resulted in few peeling residues and had excellent cleaning removing properties.

(Outgas Test)

In Example 1 and Comparative Examples 1 and 2, the agglutinant was cured, and the pellicle frame with the separator peeled was cut into several pieces. The cut pellicle frame was placed in a glass bottle, sampling was performed at 50° C. for 30 minutes using a headspace sampler (manufactured by Perkin Elmer Japan Co., Ltd., Turbo Matrix HS), and GC-MS analysis was performed using a GC-MS device (manufactured by Shimadzu Corporation, QP-5050A) and Column HP-5 (film thickness: 0.25 µm, inner diameter: 0.25 mm, length: 30 m). As a result, the outgas amount of Example 1 was less than those of Comparative Examples 1 and 2.

Further, the pellicles produced in Example 1 and Comparative Example 1 were each bonded to a mask substrate, and the outgas amount during irradiation with an ArF excimer laser was evaluated. As a result, the outgas amount of Example 1 was less than that of Comparative Example 1.

(Eluted Ion Test)

The agglutinant for pellicles of the present invention can make it relatively easy to reduce impurities derived from raw materials. As a result, the amount of eluted ions from the agglutinant can be reduced.

In Example 1 and Comparative Example 2, the pellicle frame with the cured agglutinant was cut into several pieces with the separator attached. The cut pellicle frame was placed in a polyethylene container, 100 ml of pure water was added, and the container was sealed for dipping at 90° C. for 3 hours. Next, the extracted water from which the eluted components were extracted was analyzed using an ion chromatography system (manufactured by Dionex, 2050i type). The results are shown in Tables 1 and 2. The results of Tables 1 and 2 confirmed that the reduction of eluted ions was achieved by the agglutinant for pellicles of the present invention.

the acrylic polymer consisting of, as monomer components:
- a (meth)acrylic acid alkyl ester having an alkyl group with 4 or less carbon atoms; and
- a (meth)acrylic acid ester having an ether bond, wherein an amount of the a (meth)acrylic acid ester having an ether bond is 40 to 60 mass % in a whole monomer components, and the (meth)acrylic acid ester having an ether bond comprises at least one selected from the group consisting of 2-butoxyethyl (meth)acrylate, phenoxyethylene glycol (meth)acrylate, methoxydiethylene glycol (meth)acrylate, ethoxypolyethylene glycol (meth)acrylates, butoxypolyethylene glycol (meth)acrylates and phenoxypolyethylene glycol (meth)acrylates.

2. The pellicle frame as claimed in claim 1, wherein a ratio of the (meth)acrylic acid alkyl ester having an alkyl group is 20 to 59 mass % in the whole monomer components.

3. The pellicle frame as claimed in claim 1, wherein the (meth)acrylic acid alkyl ester having an alkyl group with 4 or less carbon atoms comprises a (meth)acrylic acid alkyl ester having a $C_4$ alkyl group.

4. The pellicle frame as claimed in claim 1, wherein the (meth)acrylic acid ester having an ether bond is a (meth)acrylic acid ester having an ethylene oxide group.

TABLE 1

| | | Anion[ppb] | | | | | |
| | Agglutinant | Cl | NO$_2$ | Br | NO$_3$ | PO$_4$ | SO$_4$ |
|---|---|---|---|---|---|---|---|
| Example 1 | SN-25B | 0.2 | Detection limit or less | Detection limit or less | 0.6 | Detection limit or less | Detection limit or less |
| Comparative Example 2 | SK-1495S | 0.6 | Detection limit or less | Detection limit or less | Detection limit or less | Detection limit or less | Detection limit or less |

TABLE 2

| | | Cation[ppb] | | | | | |
| | Agglutinant | Li | Na | NH$_4$ | K | Mg | Ca |
|---|---|---|---|---|---|---|---|
| Example 1 | SN-25B | Detection limit or less | 0.3 | 2.4 | Detection limit or less | 0.6 | Detection limit or less |
| Comparative Example 2 | SK-1495S | Detection limit or less | 0.2 | 4.2 | Detection limit or less | 0.1 | Detection limit or less |

EXPLANATION FOR REFERENCE NUMERALS

1: exposure original plate
10: pellicle
11: pellicle frame
12: pellicle film
13: adhesive material layer for bonding pellicle film
14: agglutinant layer
15: air pressure adjustment hole (vent)
16: dust removal filter Scopes of what is claimed:

1. A pellicle frame with an agglutinant layer, comprising:
a pellicle frame; and
an agglutinant layer provided on one end face of the pellicle frame and obtained from an agglutinant for pellicle,
the agglutinant for pellicles comprising a reaction product of an acrylic polymer and a curing agent, 5. The pellicle frame as claimed in claim 1, wherein the agglutinant is used to produce an ArF pellicle.

6. A pellicle comprising:
a pellicle film;
the pellicle frame comprising the agglutinant layer as claimed claim 1.

7. An exposure original plate with a pellicle, comprising:
an exposure original plate; and
the pellicle as claimed in claim 6 mounted on the exposure original plate.

8. An exposure method comprising performing exposure using an exposure original plate with the pellicle as claimed in claim 6.

9. The exposure method as claimed in claim 8, wherein an exposure light source is ArF.

10. A method for producing a semiconductor, comprising a step of performing exposure using an exposure original plate with the pellicle as claimed in claim 6.

11. The method for producing a semiconductor as claimed in claim 10, wherein an exposure light source is ArF.

12. A method for producing a liquid crystal display board, comprising a step of performing exposure using an exposure original plate with the pellicle as claimed in claim 6.

13. The pellicle frame of claim 1 wherein the acrylic polymer is crosslinked.

14. The pellicle frame of claim 1, wherein a weight average molecular weight of the acrylic polymer is from 700,000 to 2.5 million.

15. A pellicle frame with an agglutinant layer, comprising:

a pellicle frame, and an agglutinant layer provided on one end face of the pellicle frame and obtained from an agglutinant for pellicle, the agglutinant for pellicles comprising a reaction product of an acrylic polymer and a curing agent, the acrylic polymer consisting of, as monomer components:

a (meth)acrylic acid alkyl ester having a $C_4$ alkyl group;

a (meth)acrylic acid ester having an ethylene oxide group; and an unsaturated monomer having a carboxyl group, wherein an amount of the (meth)acrylic acid ester having an ethylene oxide group is 40 to 60 mass % in a whole monomer components, the (meth)acrylic acid ester having an ether bond comprises at least one selected from the group consisting of 2-butoxyethyl (meth)acrylate, phenoxyethylene glycol (meth)acrylate, methoxydiethylene glycol (meth)acrylate, ethoxypolyethylene glycol (meth)acrylates, butoxypolyethylene glycol (meth)acrylates and phenoxypolyethylene glycol (meth)acrylates, and the unsaturated monomer having a carboxyl group comprises at least one selected from the group consisting of maleic acid, crotonic acid, and fumaric acid.

16. The pellicle frame as claimed in claim 15, wherein the agglutinant is used to produce an ArF pellicle.

17. A pellicle comprising:

a pellicle film;

the pellicle frame; and the agglutinant as claimed in claim 15.

18. An exposure original plate with a pellicle, comprising:

an exposure original plate; and the pellicle as claimed in claim 17 mounted on the exposure original plate.

19. An exposure method comprising performing exposure using an exposure original plate with the pellicle as claimed in claim 18.

20. A method for producing a semiconductor, comprising a step of performing exposure using an exposure original plate with the pellicle as claimed in claim 18.

* * * * *